Figure 1A:
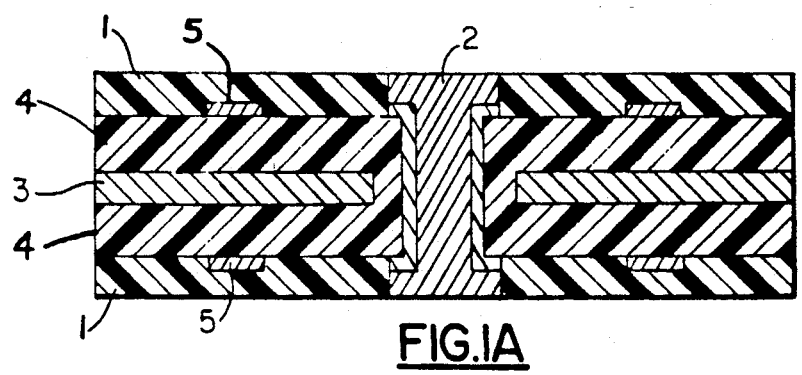

United States Patent [19]
Bindra et al.

[11] Patent Number: 5,229,550
[45] Date of Patent: Jul. 20, 1993

[54] ENCAPSULATED CIRCUITIZED POWER CORE ALIGNMENT AND LAMINATION

[75] Inventors: Perminder S. Bindra, South Salem, N.Y.; Dennis A. Canfield, Montrose, Pa.; Voya Rista Markovich, Endwell, N.Y.; Jeffrey McKeveny, Binghamton, N.Y.; Robert E. Ruane, Endicott, N.Y.; Edwin L. Thomas, Alalachin, N.Y.

[73] Assignee: International Business Machines, Armonk, N.Y.

[21] Appl. No.: 847,122

[22] Filed: Mar. 31, 1992

Related U.S. Application Data

[62] Division of Ser. No. 605,615, Oct. 30, 1990, Pat. No. 5,129,142.

[51] Int. Cl.⁵ .............................................. H05K 1/00
[52] U.S. Cl. .................................... 174/262; 361/414
[58] Field of Search ..................... 174/262, 263, 264; 361/412, 414, 416; 428/901

[56] References Cited

U.S. PATENT DOCUMENTS

| | | | |
|---|---|---|---|
| 4,685,033 | 8/1987 | Inoue | 361/414 |
| 4,721,831 | 1/1988 | Vora | 174/262 X |
| 4,774,632 | 9/1988 | Neugebauer | 361/414 X |
| 4,783,722 | 11/1988 | Osaki et al. | 361/412 X |
| 4,803,595 | 2/1989 | Kraus et al. | 361/416 X |
| 4,886,699 | 12/1989 | Carroll et al. | 428/901 X |
| 4,916,260 | 4/1990 | Broaddus et al. | 361/414 X |
| 5,072,075 | 12/1991 | Lee et al. | 174/264 |
| 5,077,115 | 12/1991 | Arthur et al. | 428/901 X |

Primary Examiner—Leo P. Picard
Assistant Examiner—Trinidad Korka
Attorney, Agent, or Firm—Lawrence R. Fraley

[57] ABSTRACT

A structure and method are disclosed for making high density circuit board. Using photosensitive or other dielectric materials over a circuitized power core, vias and lands are opened up, filled with joining metal and aligned with the next level, eliminating a major registration problem in building up a high density composite and reducing the number of steps in the manufacturing process.

7 Claims, 3 Drawing Sheets

ENCAPSULATED CIRCUITIZED POWER CORE ALIGNMENT AND LAMINATION

This is a Divisional of application Ser. No. 07/605,615, filed Oct. 30, 1990, now U.S. Pat. No. 5,129,142.

TECHNICAL FILED

This invention relates to printed circuit boards, and particularly to high density, high performance printed circuit boards.

BACKGROUND OF THE INVENTION

Although there has been considerable activity in the art of printed circuit boards, high density printed circuitry is a relatively recent area of investigation. Only recently have materials and processes been developed which can be used to provide the demanding electrical and mechanical properties required by high density configurations. High density packaging configurations are required in order to furnish fast access to large amounts of data in the next generation of computers, such as in supercomputers. The requirement of high density includes the necessity of increased wiring density and thinner dielectric layers for enhanced dimensional control. Conducting layers are electrically connected by vias and through-holes of increasingly narrow diameter. The term vias is normally used to describe conductive pathways within the circuit board which connect adjacent conductive layers. The term through-hole is normally used to describe vias which extend to non-adjacent conductive layers. The term blind via is sometimes used to refer to a through hole which terminates internally. For the sake of brevity, the term through-hole may hereinafter be used to refer to both.

High performance packaging refers to circuit cards and boards with very high wiring densities and via densities, which are typically made of insulating layers comprising a high performance dielectric material, i.e. having a dielectric constant ($E_r$) of about 3.2 or less, at least in the signal line area, in order to reduce signal propagation delays and reduce signal noise and attenuation. A dielectric constant of 3.2 or less also permits reduction in signal-to-power spacings. In the present invention, the term high density typically refers to dimensions of the following approximate values in a printed circuit card or board:

| | |
|---|---|
| Line Width | 50 Microns (Approx. 2. mils) |
| Line Thickness | 12.5 Microns (Approx. 0.5 mils) |
| Via Diameter | 63 Microns +/− 25 Microns (2.5 +/− 1.0 mil) |
| Land Diameter | 120 Microns (4.7 mils) |
| Clearance Hole | 170 Microns (6.7 mils) |
| Core Thickness | 127 Microns (5.0 mils) |

Packaging chips in a surface mount mode, called also direct chip attach (DCA), can require wiring densities exceeding several thousand inches per square inch and via densities which can exceed 10,000 vias per square inch for very high I/O chips in close proximity.

A high density circuit board having the abovementioned dimensions would be capable of providing wiring capability of approximately 100 inches per share inch per wiring plane and via densities of about 5,000 to about 10,000 vias per square inch. The total wiring requirement would be satisfied by adding a sufficient number of wiring planes to accommodate the number of chips. The small diameter via typically required precludes building such a high density board through traditional multilayer lamination and drill processes. In order to produce wiring and via densities of this magnitude, stacked via method are used. A stacked via board is a board which is made up of individual 2S1P (two signal planes plus one power plane) units joined at the vias to provide communication between 2S1P units. A structure, and a process for encapsulating 2S1P units and joining them to each other is a primary concern of this invention.

Suitable materials which can be used to provide an $E_r$ of 3.2 or below include fluorocarbons such as, for example, polytetrafluoroethylene (PTFE), polychlorotrifluoroethylene (CTFE), and polyperfluoropropylene, optionally filled with a filler, such as certain kinds of quartz or silicon particles, and optionally reinforced with fabric such as woven fluorocarbon fabric. The adhesion between fluorocarbons and metals is problematic, as well as are techniques for providing through holes of about 1.5 mils (0.038/mm) to about 3.5 mils (0.0889 mm) in diameter, which must be aligned between layers. Conductor lines are in the range of about 50 microns in width.

In circuit boards which do not have the stringent dimensional requirements of high density circuit boards, alignment of through holes from layer to layer is made indirectly, by aligning mechanical location slots which are peripheral to the function of the device and are placed over locating pins in order to align multiple layers. However, in high density circuit boards, the denser circuitry, finer conductor line and track width, thinner dielectric layers, greater number of layers and denser placement of smaller diameter holes and vias require an absolute, dead-on alignment from layer to layer that is not attainable through means that were satisfactory in the past. In the high density circuitry of the future, through-hole tolerance is such that a small misalignment can mean that there is no electrical interconnection at all, or a high resistance interconnection, between the layers where low resistance contact is required. The alignment of wire cores to each other is thus seen to be a very demanding registration operation requiring optical registration at the key registration step, viz. drilling, exposing circuitry, laminating layers together. This alignment is currently verified by means of attachment coupled with x-ray examination. Alignment problems are discussed in U.S. Pat. No. 4,788,766 issued Dec. 6, 1988 to Burger et al, which describes 2.00 ppm cap shrinkage during processing. Cap shrinkage can significantly affect alignment and becomes especially important at the time when the chip is mounted.

In addition, process flows in the cap manufacturing process typically can include a large number of steps, as many as eight or more, in order to join just two cores, whereas the present invention involves a significant reduction in process steps.

The present invention reduces the need for x-ray verification of alignment since alignment can be verified electrically on a subcomposite level. Even in the past, problems in layer alignment where vias are about 15 mils or less in diameter were noted. In U.S. Pat. No. 4,566,186 issued Jan. 28, 1986 to Bauer et al, a method is described which includes applying a layer of photoimageable dielectric over a silk screened conductive polymer thick film, which is comprised of a metal dispersed in a polymer. Vias are exposed in the photoimageable dielectric, permitting vias to be as small as about 1 to about 5 mils in diameter. A solder masking step is also included. The techniques and materials described in the '186 patent, however, such as silk screening, would be inapplicable to the dimensions of the high density printed circuit board of the present invention. Also, the present invention does not employ a thick conductive polymer.

U.S. Pat. No. 3,934,335 issued Jan. 27, 1976 to Nelson describes a number of sources of alignment problems and known attempted solutions. The '335 patent describes the use of a photosensitive dielectric material in a process that seeks to avoid alignment problems and eliminates drilling from layer to layer by applying successive layers of photoactive dielectric, upon which circuit conductors are applied, and exposing and developing via openings and circuitry patterns therein. In the present invention, dielectric material, which may be photosensitive, is applied over existing wire core circuitry in order to encapsulate the circuitry on the 2S1P structure. It is not used as a base upon which circuit conductors are applied, nor as a dielectric layer between signal and power layers. It is, however, a dielectric layer between adjacent signal layers, i.e. between S2 and S3, between S4 and S5, etc.

U.S. Pat. No. 4,648,179 describes simultaneous bonding at pads of vias filled with bonding metallurgy and lamination of polyimide dielectric of a core to like structures of a second core as a way of avoiding registration problems. The present invention does not require the pad to pad alignment, but is self aligning by way of the bonding metallurgy itself.

Nowhere in the art is the method or structure of the present invention described, wherein a dielectric material encapsulates each high density wire core, and wherein encapsulated high density cores are aligned, using the joining metal for alignment, to test on the subcomposite level and build up a high density printed circuit card or board. Furthermore, while the dielectric of the present invention may be photoactive, it need not be.

DISCLOSURE OF THE INVENTION

Accordingly it is an object of the invention to provide a high density circuit board while avoiding the problems which remain unsolved or incompletely solved by the prior art.

More particularly, it is an object of the invention to produce a high density circuit board device having vias metallized with joining metal for interlayer alignment and electrical communication.

It is a further object of the invention to produce vias and lands in a high density circuit board without smearing or shorting between conductors.

It is yet another object of the present invention to provide a printed circuit board which is testable at the core level and at the subcomposite and composite levels.

A method of the present invention involves making an encapsulated circuitized power core for a multilayer printed circuit board comprising providing a first circuitized power core (CPC) encapsulated with dielectric material having vias and lands opened in preselected areas; coating the encapsulated circuitized power core with a first layer of dielectric material; opening up discrete areas in the first layer of dielectric material corresponding to the preselected vias and lands in the circuitized power core; depositing an electrically continuous metal layer in the vias, on the lands and over the layer of dielectric material; coating the electrically continuous metal layer with a second layer of dielectric material; opening up discrete areas in the second layer of dielectric material corresponding to the preselected vias and lands in the circuitized power core; metallizing the opened up vias, at least the surface to be joined of which comprises joining metal; removing the second layer of dielectric material; and removing the electrically continuous metal layer.

The resulting structure is also the invention.

According to the present invention there is provided a method for making a circuitized power core.

Figure 2A:
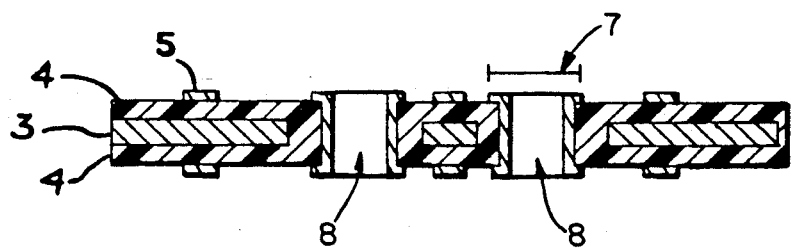

The starting point is a circuitized power core, (CPC), which comprises a dielectric coated power plane having signal lines and lands at the exterior and having at least one via between the two major external surfaces, as shown in FIG. 2a. The core in the Figure is also called a 2S1P core for its two signal/one power plane. The power plane may be comprised, for example, of Invar or copper, or copper clad Invar, or copper clad molybdenum. The completed CPC is coated with a dielectric material which may or may not be photosensitive and may be either thermoplastic or thermosetting. In either case, the material is processed to form cavities at each via-land site at which a joining metal connection is desired. In the case of a photosensitive dielectric, the material would be photo processed to form the cavities by means such as ultraviolet, electron beam or x-ray lithography, depending on the nature of the photosensitive dielectric material. In the case of a non-photosensitive dielectric, the cavities would be formed through, for example, laser ablation at the sites where a connection is desired.

After the cavities are formed and cleaned, if required, the structure is subjected to a metallization process which deposits a thin electrically continuous metal layer everywhere on the external surfaces. This continuous layer of metal is necessary if the joining metal to be used is to be applied through an electroplating process (e.g. lead-tin, gold, gold-tin, etc.). The joining metal is selected to be compatible with the laminating conditions to which the structure will be submitted. After metallization, a photoresist material is applied and processed to isolate the cavities which were formed at the desired land-via sites. The joining metal can then be applied only where required. Next, the photoresist material is removed through a stripping operation and the thin metal commoning layer removed through a flash etch process, leaving joining metal at the appropriate sites. Joining metal can alternatively be plated to the height of the photosensitive dielectric material and then joined. At this point, the CPC is ready for testing and for joining to other CPC's to form composites containing multiple signal and power planes.

Depending on the application, dielectric may have to be applied to both the top and bottom of CPC's prior to joining in order to obtain a dielectric to dielectric joining in addition to the electrical joining. In the case of a photosensitive dielectric material, as one option, the top and bottom CPC's would be made in a manner similar to the center CPC except that no metallization step would be performed. The requirement for the application of a dielectric on the top and bottom cores is determined by the joining metal thickness, the dielectric thickness and the desired spacing between conductors. After a preselected number of cores thus prepared are conventionally laminated, joined and finally cured, they can again be tested as a composite unit and optionally provided with surface mounted chips or other components.

The method of carrying out the invention is illustrated in the accompanying figures.

BEST MODE FOR CARRYING OUT THE INVENTION

Figure 1B:
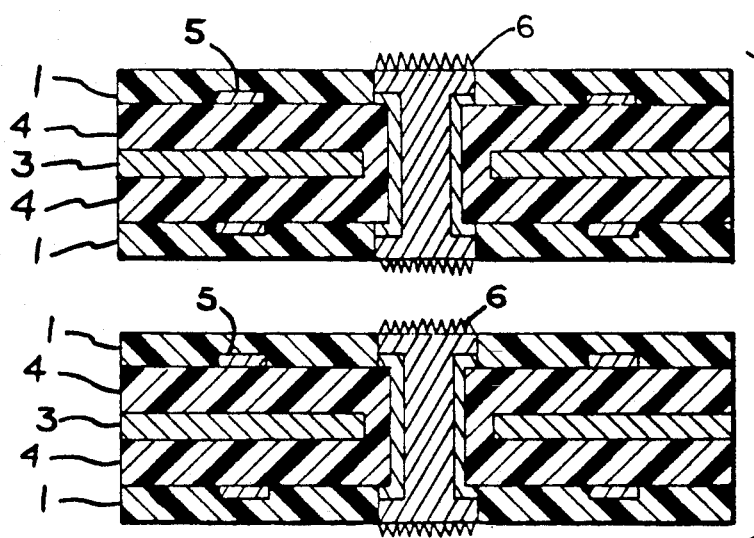

FIG. 1A shows an encapsulated circuitized power core (a/k/a encapsulated wire core) ready for joining to a like core. A dielectric material, optionally photosensitive (1) is disposed atop the CPC, except for the land and via areas which have been opened. The via is filled and the land is coated with joining metal (2) such as Au, AuSn, SnPb, dendritic Cu or paste. The power core itself (3) is surrounded top and bottom with dielectric material (4), on which signal lines (5) are disposed. The structure shown is a building block for a multilayer circuit board. FIG. 1B shows the structure of 1A ready to be joined to a like structure by way of dendritic connectors (6).

Figure 2B:
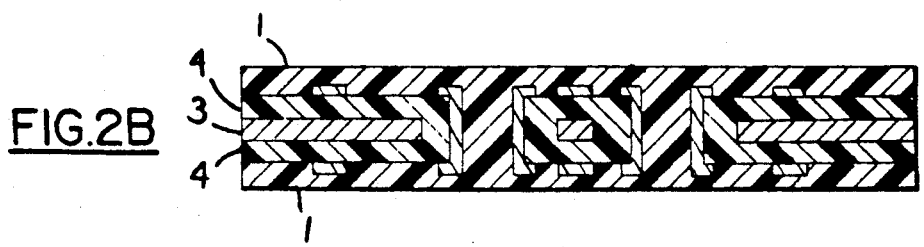

FIGS. 2 A, B and C show the initial processing steps for both of two additional embodiments, each of which is further illustrated in the FIGS. following them. 2A shows a 2S1P circuitized power core having open vias (8). 2B shows 2A after dielectric material (1), optionally photosensitive, is applied overall. 2C shows 2B after the via holes (8) and lands (7) have been opened up in the dielectric material.

Figure 2C:
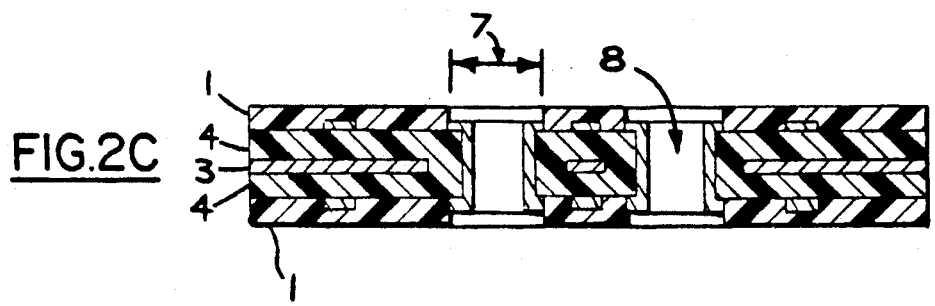
Figure 3A:
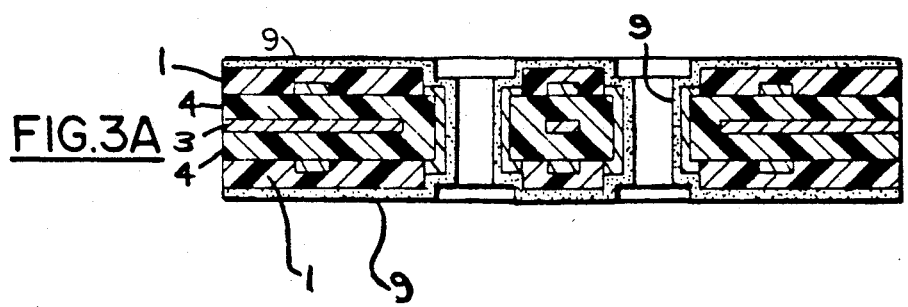
Figure 3B:
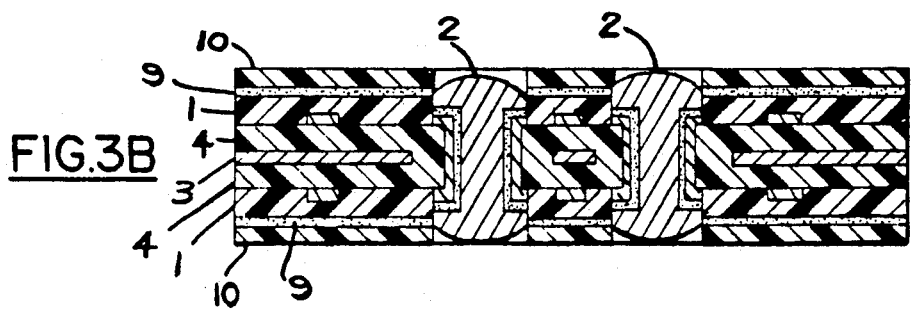
Figure 3C:
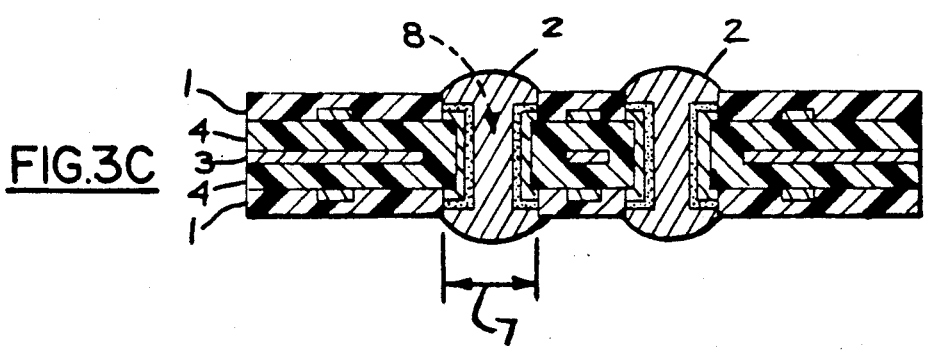
Figure 3D:
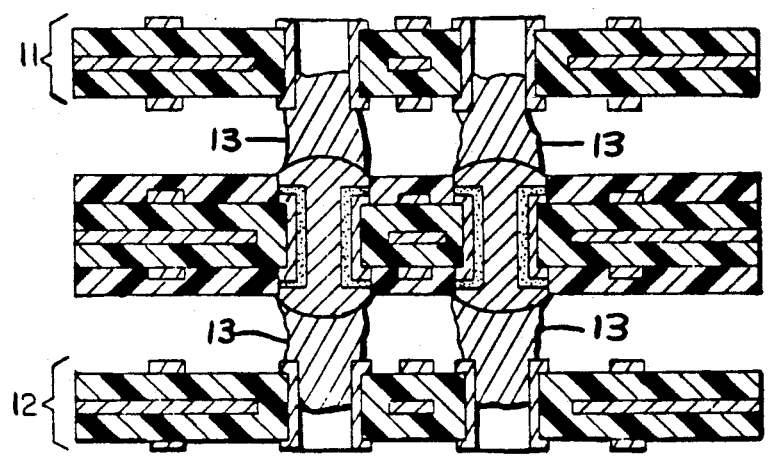

FIGS. 3 A, B and C continue the processing from FIG. 2C in an embodiment of the invention. 3A shows 2C after flash metallization (9) of an electrically continuous layer which is optionally sputtered copper over chrome. 3B shows 3A after dielectric material (10), such as photoresist, has been applied and the vias (8) and lands (7) have been opened up and filled with joining metal (2) above the level of the surface flash metallization (9). 3C shows 3B after the top layer of photoresist or other dielectric (10) and the layer of flash metallization (9) have been removed from the major surfaces, leaving at the surface a slight protrusion called a stud of joining metal (2) over via (8) and land (7). The structure is called a male CPC. 3D shows 3C after alignment, in the process of being joined to two additional, female, circuitized power cores (11) and (12), one on each major surface. In the figure the joining metal of the male CPC is contacted to that of the female by interdigitated cone or dendrite type protrusions. If the CPCs pass testing, they can be laminated and permanently joined, optionally using also paste 13 or solder balls with wave solder which enters the vias in the female CPC by capillary action, or by transient liquid bonding as described in copending Ser. No. 07/536,145 to Reid et al, filed in the United States Patent and Trademark Office on Jun. 11, 1990 and commonly assigned to the present assignee.

Figure 4A:
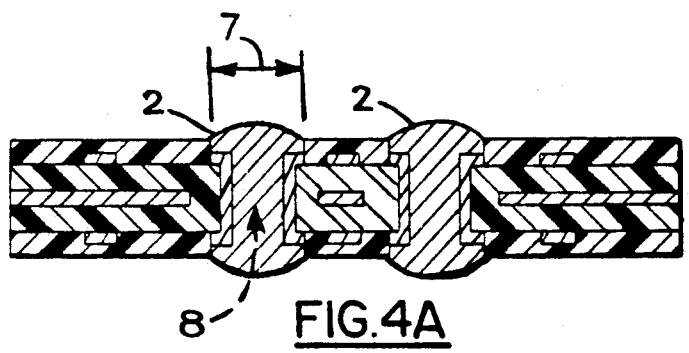
Figure 4B:
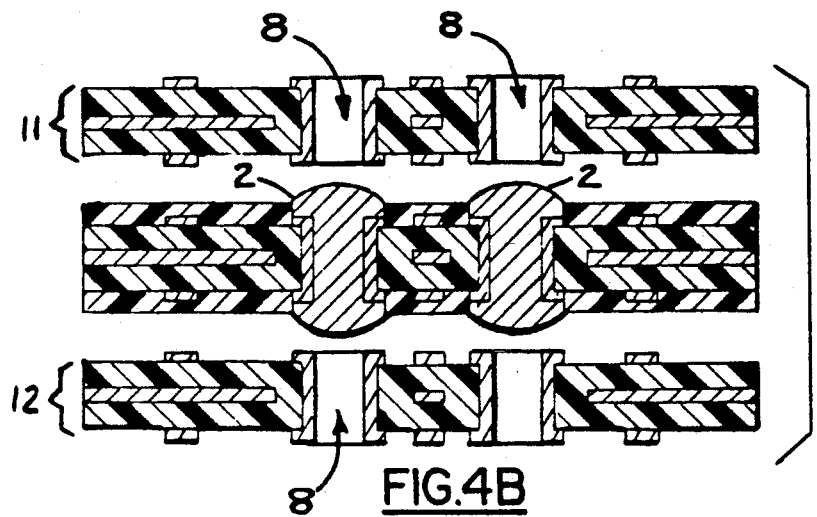

FIGS. 4 A and B continue the processing from FIG. 2C in an alternate embodiment of the present invention. 4A shows 3C after joining metallization (2) has filled the vias (8) and covered the lands (7), leaving at the surface a slight protrusion. 4B shows 4A after alignment, in the process of being joined and laminated to two additional circuitized power cores (11) and (12), one on each major surface, the joining metal (2) to fill the vias (8) of the additional cores by capillary action.

The following experiments are reported to indicate materials which have been used in making an encapsulated power core. The invention is not limited to the materials described, however, as long as the dielectric materials and the joining metal used therewith are compatible with respect to their respective curing, lamination and melting temperatures.

Feasibility experiments were performed using both a photosensitive dielectric approach and a non-photosensitive approach. The photosensitive material was OPR (Optimized Permanent Resist, described in U.S. Pat. No. 4,940,651 issued Jul. 10, 1990 to Brown et al, which is incorporated herein by reference). The non-photosensitive material was a filled polytetrafluoroethylene (PTFE) obtained from Rogers Corporation.

The process flow for the OPR material was as follows:

1. Structure Made Using Photosensitive Dielectric

1. OPR photosensitive dielectric material was applied to the surfaces of a circuitized power core (CPC) using an E. I. Du Pont De Nemours and Co. SMVL-130 vacuum laminator operated at a temperature of about 100 degrees C. and a pressure of 3.3 millibar.

2. The OPR photosensitive dielectric was exposed to an artwork pattern which permitted exposure everywhere except at the land sites at which joining would be accomplished later. Exposure was effected by a Tamarack model 161 tool, at an expose energy of 600 mJ.

3. After exposure the unit was baked at about 110 degrees C. for about 10 minutes, and then OPR developed in gamma-butyrolactone for about 30–60 seconds, water rinsed and dried.

4. Post develop cure advancement of the OPR was effected by first blanket exposing the core to a UV (ultraviolet) source at 4 j total, followed by a 150 degree C. bake for about 30 minutes.

5. In order to improve the adhesion of the metal to be applied in subsequent steps, the OPR was subjected to a mild, i.e. about 35 PSI, vapor blast operation with aluminum oxide slurry.

6. Copper metal was sputtered on the OPR surfaces. Thickness of the copper was about 3000 Angstroms. The sputtering operation was performed in a Leybold-Heraeus Model Z600 sputter system.

7. The sputtered copper was then treated to improve subsequent photoresist adhesion by exposing the cores to the following process:

| | |
|---|---|
| HCl Rinse (8% Solution) | 20 sec. |
| Water rinse in DI water | 60 sec. |
| Sodium Carbonate Rinse (30 gms/liter) | 30 sec. |
| Water Rinse | 60 sec. |
| Benzotriazole (4 gm/liter) | 90 sec. |
| Water Rinse in DI water | 60 sec. |
| Oven dry | |

(All times are approximate and are not critical.)

8. Photoresist was applied [Riston, Type T168 (0.6 mil thickness)) a polymethyl methacrylate (PMMA) from E. I. DuPont de Nemours and Co.] using a hot roll laminator operated at about 100 degrees C. (Riston is a trademark of E. I. Du Pont de Nemours and Co.).

9. Exposure of the Riston photoresist was performed on a U/V expose tool (Tamarack Model 161) at an expose level of 38 mj.

10. Development of the Riston photoresist was done in a standard Riston developer in about 50 seconds followed by a water rinse and dry. The developer was MCF (1,1,1 Trichloroethane (a/k/a Methylchloroform).

11. Gold joining metal was plated into the 'well' formed in both the Riston photoresist and photosensitive Dielectric at the sites where joining is to be done. In the experimental case, the gold plating thickness was 1.8 mils to approximately match the OPR thickness. The plating bath was a Sel-Rex cyanide gold bath.

12. After the gold plating step, the photoresist was removed by immersing the core in a methylene chloride solvent bath for about 50 seconds, rinsed and dried.

13. Finally, the sputtered copper commoning layer was removed by subjecting the core to a cupric chloride, standard copper etching solution. Any other suitable etchant would be usable, including additionally sodium persulfate solution.

The encapsulated power core structure treated in steps 1-13 above was next joined to a second, similarly built unit aligning the gold plated dots on each core and laminating the cores at a sufficiently high temperature and pressure to effect a thermo-compression bond between the gold layers.

It is anticipated that a similar process could be used to bond wire cores using the HTM material in place of the OPR material described. HTM (High Temperature Mask) is described in co-pending Ser. No. 382,311 to Gelorme et al, filed in the United States Patent and Trademark Office Jul. 20, 1989 and commonly assigned to the present assignee.

Briefly, photosensitive dielectric material is used to encapsulate the circuitry on a 2S1P structure. The material is then photoimaged to form openings for plating of joining metallurgy to the lands on the 2S1P structure where electrical continuity to an adjacent 2S1P structure is desired. The bonding of adjacent 2S1P structures is achieved by aligning the corresponding lands that are covered with joining metal so that bonding takes place at the metal-metal interface during lamination. The joining metallurgy is selected to be bondable at the temperature at which the dielectric is laminated. Testing can be performed at any subcomposite level as well as at the composite level.

2. Structure Made Using Non-Photosensitive Dielectric

A second method which has been used to build encapsulated circuitized power cores (CPC's) for stack joining is described in the following process sequence in which photosensitive dielectric material is not used:

1. The dielectric material was applied to the surfaces of a CPC by lamination in a press at 300-500 psi and approximately 390 degrees C. Rogers 2810 and 2511 dielectrics were used in this process sequence.

2. After lamination, the copper foil cover sheets were etched to expose the dielectric surface. Standard copper etchants were employed.

3. The cores were then laser drilled to produce the 'well' at the sites where core to core joining would be done. Laser drilling parameters depend on the equipment configuration used and 'wells' were successfully drilled with both an excimer laser and a CO2 laser.

4. Cleaning of the drilled 'wells' may be required, particularly in the CO2 case. Cleaning may be done through either a mechanical process such as vapor blast or through a plasma etch process depending on the size and depth of the 'well'.

5. After the 'wells' were made, copper metal was sputtered on the dielectric surfaces. Thickness was approximately 3000 Angstroms.

6. Next, the surface was treated to improve resist adhesion by processing through BTA, as described in step 7 above for the OPR process.

7. Riston photoresist was applied, exposed and developed as described above in OPR steps 8 through 10.

8. The core was then additively plated to a thickness of approximately 0.0003". In practice, the core was plated via an electroless plating process but, because of the presence of the sputtered copper commoning layer, electroplating baths could also have been used.

9. After plating, the Riston resist was removed and the commoning layer etched as described in steps 12 and 13 above.

10. Joining metal was deposited into the copper plated 'wells' by passing the core over a solder wave. The effect of the solder wave was to deposit solder in the 'wells' at the joining sites.

Joining of similar cores was done by bringing two or more cores together such that the Sn—Pb on each core was in contact at the joining sites. The mated cores were then processed through a thermal cycle in a lamination press to reflow the solder. These process sequences are included to show the techniques used to build feasibility samples. Both gold and tin-lead were used to join samples of limited size and limited numbers of join sites. Other metals could also be used, for example goldtin, tin-bismuth, etc. depending largely on the dielectric selected. In general, epoxy based dielectrics are cured and laminated at relatively low temperatures, which, depending on the particular epoxy, can be about 125 degrees C. to about 175 degrees C. This temperature range would not be suitable for high temperature chip join cycles or high temperature joining of subcomposites. The PTFE based dielectrics, however, are laminated at about 390 degrees C. and are suitable for high temperature applications, including high melting point joining metal.

While there have been shown and described what are at present considered to be preferred embodiments, it will be obvious to those skilled in the art that various changes and modifications may be made therein without departing from the scope of the invention as defined by the appended claims.

We claim:

1. A high performance printed circuit board comprising:
    at least two circuitized power cores, each of said circuitized power cores including a power plane coated on opposite sides thereof with organic dielectric material and having signal lines and lands located on external surfaces of said organic dielectric material, each of said circuitized power cores further including a conductive via formed therein and extending between said external surfaces of said organic dielectric material, said conductive vias being oriented within said circuit board in aligned manner adjacent each other;
    a layer of organic dielectric material located on one of said external surfaces of organic dielectric material of one of said circuitized power cores for covering said signal lines thereon and including an opening therein to expose said conductive via within said circuitized power core, said layer of organic dielectric material being positioned between adjacent surfaces of said organic dielectric material coated on said power planes of said circuitized power cores; and a quantity of solder joining metal located within said aligned conductive vias of said circuitized power cores for providing electrical coupling therebetween, said solder also extending through said opening within said layer of organic dielectric material located on said one of said external surfaces of said organic dielectric material.

2. The high performance circuit board according to claim 1 further including dendritic connectors located between said solder joining metal within said aligned conductive vias for electrically joining said solder joining metals.

3. The high performance printed circuit board according to claim 1 further including a quantity of flash metallization material located on at least one of said aligned conductive vias, said solder joining metal being located on said flash material.

4. The high performance printed circuit board according to claim 3 wherein said flash metallization material is comprised of copper and chrome.

5. The high performance printed circuit board according to claim 1 wherein said layer of organic dielectric material comprises a fluoropolymer.

6. The high performance printed circuit board according to claim 1 wherein said layer of organic dielectric material further includes a filler.

7. The high performance printed circuit board according to claim 1 wherein said solder joining metal includes tin and lead.

* * * * *